United States Patent [19]
van Werden et al.

[11] Patent Number: 5,731,132
[45] Date of Patent: Mar. 24, 1998

[54] METAL-ION FREE, AQUEOUS DEVELOPER FOR PHOTORESIST LAYERS

[75] Inventors: Karl van Werden, Bad Schwalbach; Marlies Eltgen, Eltville, both of Germany

[73] Assignee: Clariant GmbH, Frankfurt, Germany

[21] Appl. No.: 442,451

[22] Filed: May 16, 1995

[30] Foreign Application Priority Data

Jun. 1, 1994 [DE] Germany .................... 44 19 166.9

[51] Int. Cl.$^6$ ........................................ G03C 5/00
[52] U.S. Cl. ........................ 430/331; 510/176; 510/421
[58] Field of Search ...................... 430/331, 325; 510/176, 421

[56] References Cited

U.S. PATENT DOCUMENTS

| | | |
|---|---|---|
| 4,239,661 | 12/1980 | Muraoka et al. |
| 4,833,067 | 5/1989 | Tanaka et al. ............ 430/331 |
| 5,292,626 | 3/1994 | Buhr et al. ............... 430/331 |

FOREIGN PATENT DOCUMENTS

| | | |
|---|---|---|
| 0178495 | 4/1986 | European Pat. Off. . |
| 0178496 | 4/1986 | European Pat. Off. . |
| 0474010 | 8/1991 | Germany . |
| 6-3829 | 1/1994 | Japan . |
| 2193335 | 2/1988 | United Kingdom . |
| WO 94/15262 | 7/1994 | WIPO . |

*Primary Examiner*—George F. Lesmes
*Assistant Examiner*—Laura Weiner
*Attorney, Agent, or Firm*—John M. Genova; Andrew F. Sayko, Jr.

[57] ABSTRACT

The invention relates to a metal-ion-free developer which contains, in addition to at least one of the standard basic compounds, certain anionic and, optionally, non-ionic surfactants, and to a corresponding concentrate.

13 Claims, No Drawings

METAL-ION FREE, AQUEOUS DEVELOPER FOR PHOTORESIST LAYERS

BACKGROUND OF THE INVENTION

Field of Invention

The invention relates to a metal-ion-free developer which contains water and at least a water-soluble organic basic compound, and also to a corresponding concentrate. The developer is suitable for imagewise irradiated, positive-working recording layers—in particular photoresist layers.

Radiation-sensitive mixtures which are used in the production of printing plates, dry resists or photoresists usually contain naphthoquinone diazide derivatives as radiation-sensitive component. It is also possible to combine a compound which produces acid on exposure to actinic radiation with a compound which is cleaved by said acid and consequently becomes more soluble in the developer subsequently used. In addition, these mixtures usually contain polymeric binders which carry phenolic hydroxyl groups. Generally these are novolaks or polyhydroxystyrenes. They give the radiation-sensitive layer mechanical strength and resistance. Substrates from which capacitors, semiconductors, multilayer printed circuits or integrated circuits can be produced are coated with such mixtures. Special mention should be made of silicon substrates which are also thermally oxidized and/or coated with aluminum and may also be doped. Metal plates and metal sheets, for example composed of aluminum, copper and zinc and bimetal and trimetal sheets, and also electrically nonconducting sheets which are vapor-coated with metals, and paper are also suitable. These substrates may be thermally pretreated, superficially grained, incipiently etched or pretreated with chemicals to improve desired properties, for example to increase the hydrophilic nature. In order to impart a better cohesion and/or a better adhesion to the substrate surface to the radiation-sensitive layer, it may contain an adhesion promoter. In the case of silicon substrates and silicon dioxide substrates, adhesion promoters of the aminosilane type, such as 3-aminopropyltriethoxysilane or hexamethyldisilazane are suitable for this purpose.

These recording materials are usually developed after imagewise irradiation with aqueous alkaline solutions which frequently contain tetraalkylammonium hydroxide as alkaline component. As a rule, aqueous solutions of tetramethylammonium hydroxide, (2-hydroxyethyl)trimethylammonium hydroxide (=choline) or corresponding mixtures are used (U.S. Pat. No. 4,239,661). Such metal-ion-free developers have gained acceptance in the semiconductor industry, in particular in the production of integrated circuits with high resolution. The contamination of the semiconductor material with metal ions would result in malfunctions in the operation of the semiconductor component.

The semiconductor industry is producing with increasing frequency integrated circuits having structures which are markedly less than 1 μm. The increased integration density increases the requirements imposed on the photolithographic process for patterning the photoresist. If very small structures, for example vias, are to be imaged, an incomplete development is often observed in the exposed areas after the development with metal-ion-free developers—even in the case of those containing surface-active additives. Either too little or too much of the resist structures is dissolved away. Of the development faults which occur, scumming, microgrooving and T-topping are the most frequent.

"Scumming" refers to resist residues in the nonimage areas. "Microgrooving" manifests itself in the formation of small recessed or eroded regions at the base of the resist structures and occurs, in particular, in the case of high-resolution resists. The cause of "T-topping" is a sparingly soluble skin which results in a T-profile of the resist edges after the development.

These defects cannot be completely overcome by varying the lithographic process in order to generate clean, defect-free structures in the resist. For that purpose, a subsequent processing of the patterned resist layer in an oxidizing plasma reactor or by sputtering is necessary.

In the case of the subsequent etching processes for altering the substrate surface, which, for structures having a size of less than 1 μm, usually involves plasma etching, scumming or other development defects result in variable etching results or, as a result of necessary overetching, in alterations in the dimensions of the structures.

In particular, T-topping interferes with the inspection of the line width or line spacings and, in the subsequent dry etching process, affects the dimensionally faithful transfer of the dimensions of the resist structures into the substrate.

The formation of microgrooves manifests itself adversely in the etching process by increasing the extent of etching.

The effective suppression of development defects was virtually impossible with the surfactants hitherto used. At high surfactant concentrations, a high dark erosion of the resist in the unexposed areas could be observed. This resulted in the development of shallow resist profiles and in the loss of resolution.

SUMMARY OF THE INVENTION

An object of the present invention is therefore to provide an aqueous developer for positive-working photo-resist compositions with which the problems described above can be overcome. In particular, scumming, microgrooving and/or T-topping should no longer occur if this developer is used.

The object is achieved by a metal-ion-free developer which also contains certain anionic and, optionally, nonionic surfactants in addition to at least one of the standard basic compounds.

DETAILED DESCRIPTION OF PREFERRED EMBODIMENTS

A feature of the invention consequently relates to a metal-ion-free developer containing (a) water and (b) at least one water-soluble organic basic compound, which developer additionally contains c) at least one anionic surfactant of the formula

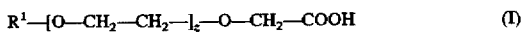

or

where $R^1$ is a $(C_1-C_{20})$ alkyl radical or a $(C_6-C_{20})$ aryl radical optionally substituted with up to 3 branched or straight-chain alkyl groups and z is an integer from 1 to 60, optionally d) at least one nonionic surfactant of the formula

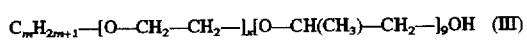

or

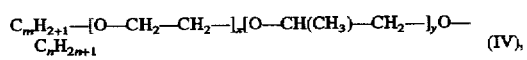

where m is a number from 10 to 22, n is a number from 1 to 6, and x and y are, independently of one another, a number from 3 to 30, and also optionally, e) at least one surfactant of the formula $$HC{=\!=}C—CR^2R^3—[O—CH_2—CH_2]_rOH \qquad (V)$$

or $$HO—[CH_2—CH_2—O—]_x—CR^4R^5—C{=\!=}C—CR^2R^3—[O—CH_2—CH_2—]_yOH \qquad (VI),$$

where $R^2$–$R^5$ are, independently of one another, hydrogen atoms or ($C_1$–$C_5$)alkyl groups and r is a number from 1 to 60;

or of the formula $$HO—[CH_2—CH_2—O—]_s[CH(CH_3)—CH_2—O—]_tH \qquad (VII),$$

where the ratio s:t is from 10:90 to 80:20, or of the formula $$R^6—[O—CH_2—CH_2—]_o—OH \qquad (VIII)$$

where $R^6$ is a ($C_6$–$C_{20}$) aryl radical optionally substituted with up to 3 branched or straight-chain alkyl groups, and o is a number from 1 to 60, the proportion of the anionic and nonionic surfactants being 10 ppm to 6,000 ppm, based on the total weight of the developer, with the proviso that the weight ratio (c):[(d)+(e)] is 3:7 to 8:2 and the proportion of the surfactants (c) is always greater than the proportion of the surfactants (d) .

The $C_mH_{2m+1}$ radical in the compounds of the formulae III and IV is generally an unbranched, fairly long-chain alkyl radical.

The developer according to the invention generally has a pH in the range from 11 to 13.5.

Preferred water-soluble organic basic compounds (b) are aliphatic or aromatic amines, such as propane-1,3-diamine or 4,4'-diaminodiphenylamine, and basic heterocyclic compounds which contain, in addition to 3 to 5 carbon atoms, at least one nitrogen atom and, optionally, also oxygen atoms or sulfur atoms in the ring, such as pyrazoles, pyrrolidines, pyrrolidinones, pyridines, morpholines, pyrazines, piperidines, oxazoles and thiazoles. Also preferred are quaternary ammonium compounds, in particular optionally substituted tetraalkylammonium compounds in which the alkyl groups have no more than 4 carbon atoms in each case. Particularly preferred compounds of this type are tetramethylammonium hydroxide and (2-hydroxyethyl) trimethylammonium hydroxide (=choline). Mixtures of different bases may also occur in the developer according to the invention. The proportion of the compounds (b) is generally 0.5 to 20 percent by weight, based on the total weight of the developer.

Preferred anionic surfactants (c) are O-carboxymethyl O'-isononylphenyl polyethylene glycols, in particular those containing 6 to 30 ethylene oxide units in the polyethylene glycol chain (formula I, z=6 to 30, $R^1$=($H_3C$)$_2$CH—[$CH_2$]$_6$—$C_6H_4$—).

Of the nonionic surfactants (d) of the formulae III and IV, those are preferred in which m=12 to 18 and n=2 to 4, x=2–8 and y=3–8.

The optionally present surfactants (e) serve to adjust the rate of development. In this connection, r is preferably 3 to 40.

"Metal-ion-free" means that the developer according to the invention contains no more than 100 ppb of metal ions.

The developer according to the invention is usually produced as a concentrate containing the constituents (b) to (e) specified above in 2 to 8 times the amount. Said concentrate according to the invention is stable, i.e. no phase separation, precipitation or turbidity occurs. It can readily be diluted again using deionized water to produce a ready-to-use, equally stable developer having optimum properties. Scumming, microgrooving and T-topping are effectively prevented by the developer according to the invention, and resolution and processing latitude are decisively improved.

EXAMPLES 1 TO 8 AND COMPARISION EXAMPLES C1 TO C2

Aqueous solutions were first prepared which contained 2.38 percent by weight of tetramethylammonium hydroxide or 4.20 percent by weight of choline. The solutions had a pH of 13. The surfactants (c), (d) and, optionally, (e) were then added in the amounts shown in the table in order to obtain the developer solutions according to the invention.

As a comparison, a developer was chosen which contained 2.38 percent by weight of TMAH and 2000 ppm of dinonyl-phenol ethoxylate, 18 EO groups (proportion of dinonyl 50 percent).

The following lithographic process was carried out:

A silicon wafer having a diameter of 3 inches was coated with a resist in accordance with EP-A 0 508 267 on a spin coater. After the subsequent baking process (prebake) at 100° C. for 120 s on a hotplate, the thickness of the resist was 1.1 μm. The coated wafer was imagewise UV-irradiated through a mask using an apparatus for reduced-scale projection (stepper FPA 1550, g-line, 0.35 NA, 400 mW/cm$^2$, Canon Ltd.). The exposure was followed by a second baking process (post-exposure bake) at 120° C. for 80 s on a hotplate.

The wafers were developed for 50 s on a track system in the puddle mode using the developer solutions described in the table. After completion of the development, the wafers were rinsed with deionized water and spin-dried.

In the table below:

A) is the resist erosion in the unexposed areas;

B) is the irradiation time (in milliseconds) for the 1:1 imaging of the mask structures in the photo-resists (the radiation energy per unit area [=irradiation] is equal to the irradiation time multiplied by the irradiance [in the present case 400 mW/cm$^2$]);

C) is the irradiation time for the field point;

D) is the ratio of (B) to (C) as a measure of the process latitude of the resist/developer system.

The developed structures were evaluated as follows with the aid of a scanning electron microscope:

++ very clean structures with very steep resist edges,

+ clean structures with steep resist edges,

− slight resist residues (scum),

−− marked scumming and T-topping.

TABLE

| Example No. | Surfactant anionic * | Surfactant nonionic / | additive * | Concentration ppm | A nm\50 s | B ms | C ms | D | Structural quality |
|---|---|---|---|---|---|---|---|---|---|
| 1 | 100% | — | — | 1000 | 12 | 340 | 215 | 1.58 | + |
| 2 | 100% | — | — | 2000 | 15 | 340 | 225 | 1.51 | + |
| 3 | 100% | — | — | 4000 | 15 | 270 | 180 | 1.50 | + |
| C1 | 40% | 60% | — | 3000 | 10 | 300 | 180 | 1.67 | − |
| 4 | 66.7% | 33.3% | — | 3000 | 10 | 340 | 220 | 1.55 | ++ |
| 5 | 75% | | 12.5% | 4000 | 16 | 280 | 200 | 1.40 | ++ |
| 6 | 60% | 12.5% | 20% | 5000 | 19 | 280 | 200 | 1.40 | ++ |
| 7 | 40% | 20% | 20% | 5000 | 18 | 270 | 180 | 1.50 | ++ |
| 8 | 33.3% | 40% | 33.3% | 2000 | 14 | 250 | 160 | 1.56 | ++ |
| C2 | — | 33.3% 100%**** | — | 2000 | 42 | 320 | 180 | 1.80 | — |

Surfactant* Polyoxyethylene isononylphenyl ether carboxylic acid, 6 ethylene oxide units (EO)
Surfactant** Fatty alkohol alkoxylate R-(EO)$_{3.5}$-(PyO)$_{5.3}$—OH, R = H$_3$C—(CH$_2$)$_{16}$— PyO = propylene oxide units
Additive*** Polyoxyethylene isononylphenyl ether, 30 EO
Surfactant**** Dinonylphenol ethoxylate, 18 EO

What is claimed is:

1. A metal-ion-free developer comprising (a) water and (b) at least one water-soluble organic basic compound, (c) at least one anionic surfactant of the formula $$R^1—[O—CH_2—CH_2—]_z—O—CH_2COOH \quad (I)$$

or $$R^1—[O—CH_2—CH_2—]_z—O—CH_2—SO_3H \quad (II),$$

where $R^1$ is a ($C_1$–$C_{20}$) alkyl radical or a ($C_6$–$C_{20}$) aryl radical optionally substituted with up to 3 branched or straight-chain alkyl groups and z is an integer from 1 to 60, and at least one surfactant selected from the group consisting of d) and e), where d) is at least one nonionic surfactant of the formula $$C_mH_{2m+1}—[O—CH_2—CH_2—]_x[O—CH(CH_3)—CH_2—]_yOH \quad (III)$$

or $$C_mH_{2m+1}—[O—CH_2—CH_2—]_x[O—CH(CH_3)—CH_2—]_yO—\atop C_nH_{2n+1} \quad (IV),$$

where m is a number from 10 to 22, n is a number from 1 to 6, and x and y are, independently of one another, a number from 3 to 30, and e) is at least one surfactant of the formula $$HC\equiv C—CR^2R^3—[O—CH_2—CH_2—]_rOH \quad (V)$$

or $$HO—[CH_2—CH_2—O—]_r—CR^4R^5—C\equiv C—C—CR^2R^3—[O—CH_2—CH_2—]_rOH \quad (VI),$$

where $R^2$–$R^5$ are, independently of one another, hydrogen atoms or ($C_1$–$C_5$) alkyl groups and r is a number from 1 to 60;

or of the formula $$HO—[CH_2—CH_2—O—]_{s[CH(CH_3)]}—CH_2—O—]_tH \quad (VII),$$

where the ratio s:t is from 10:90 to 80:20, or of the formula $$R^6—[O—CH_2—CH_2—]_o—OH \quad (VIII)$$

where $R^6$ is a ($C_6$–$C_{20}$)aryl radical optionally substituted with up to 3 branched or straight-chain alkyl groups, and o is a number from 1 to 60, the amount of the anionic and nonionic surfactants being 10 ppm to 6,000 ppm, based on the total weight of the developer, with the proviso that the weight ratio (c):[(d)+(e)] is 3:7 to 8:2 and the amount of the surfactants (c) is always greater than the amount of the surfactants (d).

2. A developer as claimed in claim 1, which has a pH in the range from 11 to 13.5.

3. A developer as claimed in claim 1, wherein the water-soluble organic basic compound (b) is an aliphatic or aromatic amine.

4. A developer as claimed in claim 3, wherein the water-soluble organic basic compound (b) is propane-1,3-diamine or 4,4'-diaminodiphenylamine.

5. A developer as claimed in claim 1, wherein the water-soluble organic basic compound is a basic heterocyclic compound which comprises 3 to 5 carbon atoms, at least one nitrogen and, optionally, also oxygen and sulfur atoms in the ring.

6. A developer as claimed in claim 5, wherein the water-soluble organic basic compound is a pyrazole, pyrrolidine, pyrrolidinone, pyridine, morpholine, pyrazine, piperidine, oxazole or thiazole.

7. A developer as claimed in claim 1, wherein the water-soluble organic basic compound (b) is tetramethylammonium hydroxide or (2-hydroxy-ethyl)trimethylammonium hydroxide.

8. A developer as claimed in claim 1, wherein the proportion of the water-soluble organic basic compound (b) is 0.5 to 20 percent by weight, based on the total weight of the developer.

9. A developer as claimed in claim 1, wherein the anonic surfactant is a O-carboxymethyl O'-isononylphenyl polyethylene glycol.

10. A developer as claimed in claim 9, wherein the polyethylene glycol contains 6 to 30 ethylene oxide units in the polyethylene glycol chain.

11. A developer as claimed in claim 1, wherein of the nonionic surfactants (d) of the formulae III and IV, m=12 to 18, n=2 to 4, x=2 to 8 and y=3 to 8.

12. A developer as claimed in claim 1, wherein of the surfactant (e), r=3 to 40.

13. A developer concentrate, which comprises the constituents (b) to (e) as claimed in claim 1 in an amount which is two to eight times higher than in the developer itself.

* * * * *